United States Patent [19]

McDermott

[11] Patent Number: 4,695,926
[45] Date of Patent: Sep. 22, 1987

[54] ENCAPSULATION AND INSULATION OF ELECTRONIC CIRCUIT BOARD STRUCTURES

[75] Inventor: Michael G. McDermott, Glenside, Pa.

[73] Assignee: Bell of Pennsylvania, Conshohocken, Pa.

[21] Appl. No.: 881,172

[22] Filed: Jul. 1, 1986

[51] Int. Cl.$^4$ ............................................. H05K 1/14
[52] U.S. Cl. ............................. 361/395; 174/DIG. 8
[58] Field of Search ............... 361/395, 419, 380, 397, 361/399; 174/52 PE, DIG. 8

[56] References Cited

U.S. PATENT DOCUMENTS

| 3,603,720 | 9/1971 | Rabie | 174/DIG. 8 |
| 3,688,396 | 9/1972 | Kilby et al. | 361/419 |
| 3,708,610 | 1/1973 | Kozel et al. | 174/DIG. 8 |
| 4,223,177 | 9/1980 | Nakamura | 174/DIG. 8 |

Primary Examiner—Roy N. Envall, Jr.
Attorney, Agent, or Firm—Lowe Price LeBlanc Becker & Shur

[57] ABSTRACT

An electronic circuit board, together with the components, circuits, and wiring patterns thereon, is encapsulated by a single heat-shrink tubing layer, or the like for insulation from environmental factors. A method for the encapsulation is disclosed, as well as products incorporating the inventive approach.

7 Claims, 4 Drawing Figures

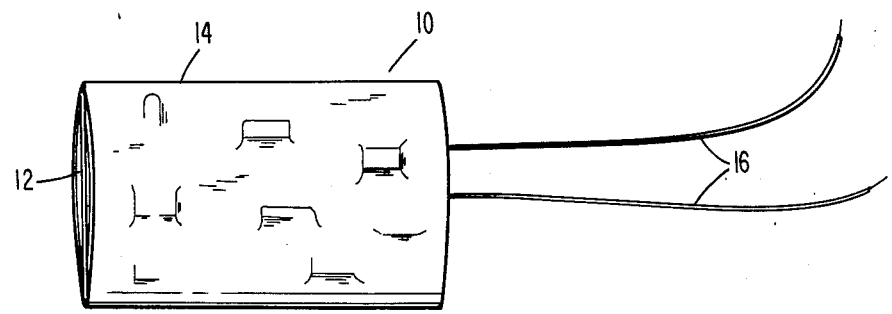
Fig. 1
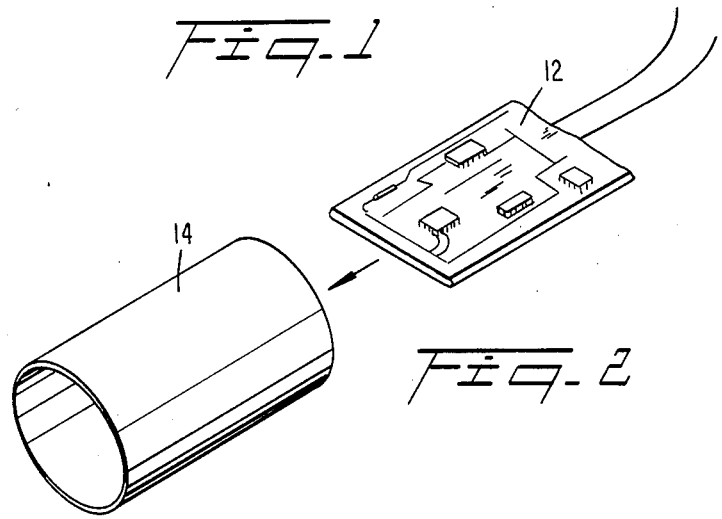
Fig. 2
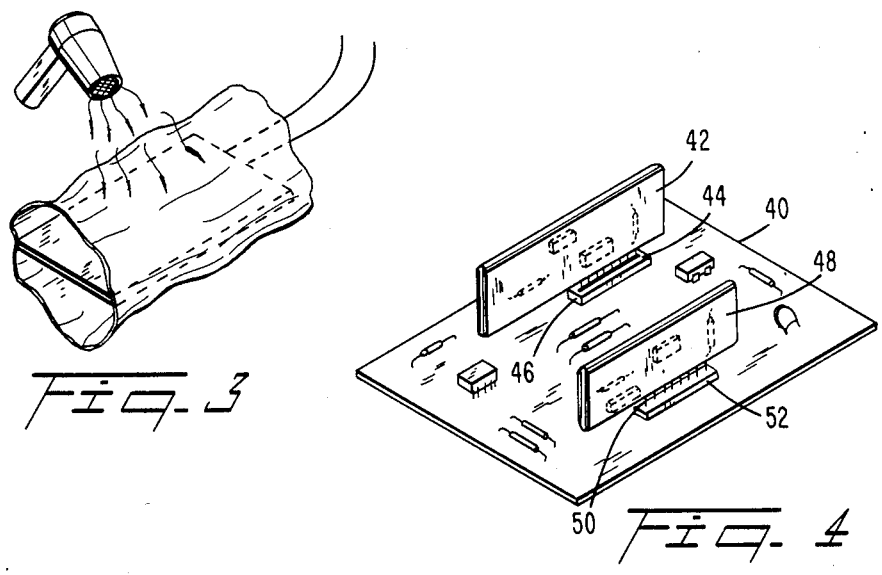
Fig. 3
Fig. 4

ENCAPSULATION AND INSULATION OF ELECTRONIC CIRCUIT BOARD STRUCTURES

BACKGROUND OF THE INVENTION

This invention relates to insulation of electronic components, and more specifically to insulation of plural electronic units, including a single insulation for a plurality of electronic components and for insulation of circuit boards on which the components are mounted.

In the prior art, it is known to insulate individual electronic component. Such insulation is described in U.S. Pat. No. 3,093,448, for example, wherein a heat shrinkable thermoplastic oriented film is used to provide a tight protective coating for encapsulation of individual electrical components.

The process described therein is contemplated for insulating individual electrical components such as condensers by a protective covering which is resistant to abrasion and moisture.

However, the prior art fails to contemplate and to provide encapsulation for electronic circuits mounted on circuit boards, for the circuit boards themselves, or for the plurality of components.

Similar deficiencies are also found in other prior art disclosures, such as U.S. Pat. No. 3,387,364, wherein a rubber-like sleeve is contemplated as being bonded to a single resistor, and U.S. Pat. No. 3,731,130, wherein a sleeve of polyvinylchloride plastics is placed and heat-shrunk around a single wound coil and the adjacent decks forming a single wound-film capacitor.

However, in present technology, many electronic devices are mounted on circuit boards, which typically include a plurality of electronic components, which are then typically sold and shipped as a unit. Whether or not mounted on a circuit board, it is widely accepted that electronic circuits are formed of a plurality of electronic components, and that such circuits are sold and shipped as a unit. The prior art, however, fails to provide insulation, weatherization, encapsulation, or protection for such modern electronic devices and circuits, whether or not mounted on circuit boards.

There is thus a need in the prior art for insulation of electronic devices which are comprised of electronic components mounted on circuit boards. Indeed, there is a need for protection of circuit boards per se and for circuits formed of plural electronic components, as well as for components mounted on circuit boards.

DISCLOSURE OF INVENTION

It is accordingly an object of this invention to provide heat-shrinkable encapsulation for circuit boards used for mounting electronic components thereon.

It is a more specific object of the invention to provide encapsulation for insulation of a circuit board having at least one electronic component mounted thereon.

Still another object of the invention is the insulation of a circuit board together with a plurality of electronic components mounted thereon.

It is yet a further object of the invention to provide heat-shrinkable encapsulation and isolation for a plurality of electronic components interconnected for forming an electronic circuit.

It is still another object of the invention to provide an electronic device, which includes at least one circuit board having a plurality of electronic components thereon, with heat-shrink insulation for the circuit board and the components mounted thereon.

Still a further object of the invention is to improve methods for making electronic circuits by mounting an electronic component on a circuit board and thereafter encapsulating the circuit by wrapping a single layer of heat-shrink tubing around and enclosing both the board and the electronic component mounted thereon.

Yet another object of the invention is to improve a method for making electronic circuits by mounting a plurality of electronic components on a circuit board and thereafter encapsulating the circuit by wrapping a single layer of heat-shrink tubing around and enclosing both the board and the plurality of electronic components mounted thereon.

In accordance with these and other objects of the invention, there is provided an electronic circuit board structure, including a circuit board for mounting electronic components and a heat shrink tubing layer enclosing the circuit board. Thus, wiring patterns and any components mounted on the circuit board are insulated from moisture.

Preferably, the electronic circuit board structure further comprises at least one electronic component mounted on the circuit board. The heat shrink tubing layer is provided as a single heat shrink layer wrapped around and enclosing the electronic component and the circuit board, thereby insulating the circuit board structure, including the circuit board and the component mounted thereon, from environmental factors.

Still more particularly, the electronic circuit board structure further includes a plurality of electronic components mounted on the circuit board, with the heat shrink tubing layer provided as a single heat shrink layer wrapped around and enclosing the plurality of electronic components and the circuit board, thereby insulating the circuit board structure, including the circuit board and the plural electronic components mounted thereon, from environmental factors.

In accordance with another aspect of the invention, there is provided an electronic circuit structure, which includes a plurality of electronic components. The plurality of electronic components are electrically interconnected to form a circuit. A heat shrink tubing layer is provided as a single heat shrink layer wrapped around and enclosing the plurality of electronic components, thereby insulating the circuit structure, including the plurality of electronic components, from environmental factors.

In accordance with still another aspect of the invention, there is provided an improved electronic device including a plurality of electronic circuit boards which mount electronic components thereon. At least one of the circuit boards provided in the electronic device has mounted thereon a plurality of electronic components. A heat shrink tubing layer is provided as a single heat shrink layer wrapped around and enclosing the plurality of electronic components and the circuit board, thereby insulating the circuit boad, including the plural electronic components mounted thereon, from environmental factors.

Yet another aspect of the invention provides an improved method for making an electronic circuit mounted on a circuit board. In accordance with the improvement, at least one electronic component is mounted on a circuit board. Thereafter, a single layer of heat shrink tubing is wrapped around and encloses the circuit board and the electronic component for insulating the board and the electronic component from environmental factors.

Preferably, a plurality of electronic components are mounted on the circuit board and the wrapping step includes the step of wrapping the single layer of heat shrink tubing around and enclosing the plurality of electronic components.

BRIEF DESCRIPTION OF THE DRAWING

The foregoing and other objects, features and advantages of the invention will become more readily apparent to those of ordinary skill in the art to which the invention pertains upon reference to the following detailed description of the best mode for carrying out the invention, when considered in conjunction with the accompanying drawing in which a preferred embodiment of the invention is shown by way of illustration, wherein:

FIG. 1 shows an electronic circuit board structure embodying the present invention, FIG. 2 shows a first step of assembly of the structure of FIG. 1, wherein a heat shrink tube layer is being located on a printed circuit board, FIG. 3 shows the application of heat to shrink the tube on the board, and FIG. 4 shows an electronic device including a plurality of circuit boards, at least one of which embodies the present invention in the manner of FIG. 1.

PREFERRED EMBODIMENT FOR CARRYING OUT THE INVENTION

Referring now to FIG. 1, there is shown generally at 10 an electronic circuit board mounted circuit which is enclosed by a layer of heat shrink tubing material, for insulating the various circuit components from moisture and the like.

More specifically, 12 refers to a circuit board, having various electronic components mounted thereon. The circuit board may be a mounting support for the electronic components, which may be interconnected by physical wiring. Alternatively, the circuit board may be a printed circuit board, having wiring patterns and the like printed thereon for interconnecting the electronic components.

Heat shrink tubing 14 is provided around the printed circuit board for encapsulating and shielding the board and the components mounted thereon. Appropriate connectors, shown in the form of leads 16, are provided for making contact with the circuits formed of the electronic components mounted on the circuit board 12.

One circuit which may be formed by the components mounted on the circuit board, and which may be encapsulated together with the circuit board by the heat-shrink insulation 14, is shown in FIG. 2. The circuit, which is a solid state repeat cycle timer, is used as an alarm repeater in a normally closed circuit. The circuit is a line powered device, designed to be an addition to circuits which use saturated ferrods as alarm sensor inputs in telephone electronic switching station (ESS) offices. Such circuits can be used as a time delayed contact closure or a reset cycle timer in open circuits, depending on the connection of the circuits. No additional power is required by the circuit, which operates from the line voltage of a central office.

The circuit of FIGS. 2 and 3 has found use in telephone central office (CO) temperature and alarm circuits that may be reported once when the alarm occurs, but not again unless the alarm resets. If the first report is unattended, the alarm would be unnoticed. Using the shown circuits as repeat cycle timers provides repetition of the alarm each predetermined time period, such as 15 minutes, until the alarm condition is reset.

In the configuration of FIG. 2, when 48 volts initially appears across the input terminals 20, the unit draws less than 1 milliampere of current, the CO circuit remaining unsaturated. If the input voltage persists longer than the specified delay time of timer circuit 22, the unit increases its current draw to a level in excess of 8 milliamperes, which is a current level capable of saturating a ferrod.

In this configuration, the CO is enabled to recognize the open circuit immediately. If the open circuiT persists, timer circuit 22 conducts and releases each 15 minutes, thus causing a steady alarm condition to be reported every 15 minutes.

In the alternate embodiment of FIG. 3, the CO is prevented from recognizing a contact closure until the closure has been effected for an average of 15 minutes. The delay time varies, depending on how long ago, and for how long, the alarm contacts were closed. Such an arrangement is useful in alarm circuits which bounce in and out, but are not meaningful until they provide a constant closure.

As will be appreciated by those skilled in the art, the invention may be practiced on other circuits, including plural electronic components, discrete or integrated, on one or more chips. The components may be grouped together, interconnected to form an electronic device or circuit, with or without a supporting circuit board. In accordance with the invention, however, in all cases more than one element of the device is encapsulated by a single heat-shrink or other insulating layer. A circuit board (and associated wiring patterns or connectors) may be so encapsulated, as may be a board and a single component or a plurality of components mounted thereon. Such a board may form a component of a larger device, as described below with reference to FIG. 4.

FIG. 4 shows an electronic device, which includes a mother board 40, for example, on which are mounted a plurality of circuit boards. For example, a circuit board 42, including thereon a plurality of circuits, is mounted to motherboard 40 by a first connector 44, through contact connectors 46. A second circuit board 48 is mounted to the motherboard 40 through contact connectors 50 and by a second connector 52. The second circuit board 48, and all the circuit components thereon, is insulated by a single layer of heat shrink tubing thereon.

The circuit board of FIG. 1, as well as the circuit board 48 of FIG. 4, is formed in a manner well known to those skilled in the art. Similarly well known is a method for mounting various electronic components, such as the timer circuits, ferrods, and other circuit components, to the circuit board. A layer of heat shrink material is then wrapped around the board (FIG. 2) and the components thereon, and heated (FIG. 3), causing appropriate shrinkage and encapsulation. The layer may be in the form of heat shrink tubing, as known in the art, or may be in other forms.

Although the foregoing description contemplates a preferred embodiment wherein the circuit components are mounted on a separate circuit board, it should be appreciated that the components may not be mounted on a separate board but may, instead, be freely attached to one another to form a circuit. Alternatively, one or more of the components may include its own mounting structure, to which other components may be mounted. The encapsulation of a plurality of circuit components by a single heat-shrinkable layer is also contemplated within the present invention.

Further, although two specific circuits have been shown encapsulated with the circuit board therefor, it should be clear that any circuit structure, of any complexity, may be mounted on and encapsulated with the circuit board. Thus, an entire system may be encapsulated by a single heat-shribnk layer and in a single heat-shrink operation, together with the supporting board therefor. Such a system may be used in a computer environment, as a board to be mounted on a motherboard, for example, as shown in FIG. 4 hereinabove described.

There has thus been shown a method for encapsulating a circuit board and the various electronic components mounted thereon, as well as circuit boards formed in accordance with the invention and electronic devices incorporating the same. In accordance with the invention, these boards are formed by mounting the electronic components thereon and thereafter enclosing the combined structure by a single heat-shrink tubing to encapsulate the board and the components, together.

The preceding specification describes a preferred embodiment of the invention as an illustration and not a limitation thereof. It is appreciated that equivalent variations will occur to those skilled in the art, such as the encapsulation of a plurality of unmounted, interconnected, circuit components. Such modifications, variations and equivalents are within the scope of the invention as recited with greater particularity in the appended claims when interpreted to obtain the benefits of all equivalents to which the invention is legally and equitably entitled.

What is claimed is:

1. An electronic circuit board structure, comprising:
    circuit board for mounting electronic components thereon, and
    a heat shrink tubing layer enclosing the circuit board, whereby wiring patterns and any components mounted on said circuit board are insulated from moisture.

2. An electronic circuit board structure as recited in claim 1, further comprising
    at least one electronic component mounted on said circuit board,
    said heat shrunk tubing layer provided as a single heat shrink layer wrapped around and enclosing said electronic component and said circuit board, thereby insulating the circuit board structure, including said circuit board and said component mounted thereon, from environmental factors.

3. An electronic circuit board structure as recited in claim 1, further comprising
    a plurality of electronic components mounted on said circuit board,
    said heat shrunk tubing layer provided as a single heat shrink layer wrapped around and enclosing said plurality of electronic components and said circuit board, thereby insulating the circuit board structure, including said circuit board and said plural electronic components mounted thereon, from environmental factors.

4. An electronic circuit structure, comprising:
    a plurality of electronic components,
    said plurality of electronic components electrically interconnected to form a circuit,
    a heat shrunk tubing layer provided as a single heat shrunk layer wrapped around and enclosing said plurality of electronic components, thereby insulating the circuit structure, including said plurality of electronic components, from environmental factors.

5. In an electronic device including a plurality of electronic circuit boards mounting electronic components thereon, the improvement comprising:
    at least one circuit board in said electronic device having a plurality of electronic components mounted on said circuit board,
    a heat shrunk tubing layer provided as a single heat shrink layer wrapped around and enclosing said plurality of electronic components and said circuit board, thereby insulating the circuit board, including said plural electronic components mounted thereon, from environmental factors.

6. In a method for making an electronic circuit mounted on a circuit board, the improvement comprising the steps of:
    mounting at least one electronic component on a circuit board,
    thereafter wrapping a single layer of heat shrink tubing around and enclosing said circuit board and said electronic component for insulating the board and the electronic component from environmental factors,
    and heating said tubing to shrink it around said board and said component.

7. The improved method recited in claim 6, wherein said mounting step includes the step of mounting a plurality of electronic components on said circuit board and said wrapping step includes the step of wrapping said single layer of heat shrink tubing around and enclosing said plurality of electronic components.

* * * * *